United States Patent
Boudreaux et al.

(10) Patent No.: US 6,625,026 B1
(45) Date of Patent: Sep. 23, 2003

(54) HEAT-ACTIVATED SELF-ALIGNING HEAT SINK

(75) Inventors: Brent A. Boudreaux, Highland Village, TX (US); Stacy Fraker, Allen, TX (US); Roy M. Zeighami, McKinney, TX (US); Eric C. Peterson, McKinney, TX (US); Christian L. Belady, McKinney, TX (US)

(73) Assignee: Hewlett-Packard Development Company, LP, Houston, TX (US)

( * ) Notice: Subject to any disclaimer, the term of this patent is extended or adjusted under 35 U.S.C. 154(b) by 0 days.

(21) Appl. No.: 10/210,000

(22) Filed: Jul. 31, 2002

(51) Int. Cl.[7] .................................................. H05K 7/20
(52) U.S. Cl. ...................... 361/705; 165/80.2; 165/80.3; 165/185; 174/16.3; 257/707; 257/712; 257/713; 257/719; 257/722; 361/710; 361/707
(58) Field of Search .............................. 165/80.2, 80.3, 165/185; 174/16.3; 257/705–706, 712–713, 720, 722, 718, 719, 726, 727; 361/690, 704–710, 714–722

(56) References Cited

U.S. PATENT DOCUMENTS

| | | | | |
|---|---|---|---|---|
| 4,897,764 A | * | 1/1990 | Bruchmann et al. | ........ 361/708 |
| 6,046,498 A | * | 4/2000 | Yoshikawa | .................. 257/707 |
| 6,292,362 B1 | * | 9/2001 | O'Neal et al. | ............. 165/80.3 |
| 6,552,906 B2 | * | 4/2003 | Kanada | ...................... 361/705 |

* cited by examiner

Primary Examiner—Gregory Thompson
(74) Attorney, Agent, or Firm—Leslie P. Gehman

(57) ABSTRACT

A heat-activated self-aligning heat sink is built thermally connecting at least one heat-generating devices on a substrate to the heat sink body, where the heat-generating devices may not be co-planar with each other due to tolerance stack-up or parallel with the heat sink body. A pedestal is attached to the substrate to support the heat sink body. A plug or floating pedestal is placed on top of each heat-generating device and held within the pedestal allowing sufficient movement for the bottom surface of the plug to fully contact the top surface of the heat-generating device. A quantity of a low melting temperature, thermally conductive material, such as solder, or a thermally conductive liquid, is placed over each plug and a heat sink body is placed over the assembly. When heated, the thermal material melts, forming a low impedance thermal junction between the plug and the heat sink body regardless of planarity differences between the two devices.

44 Claims, 15 Drawing Sheets

HEAT-ACTIVATED SELF-ALIGNING HEAT SINK

FIELD OF THE INVENTION

The present invention relates generally to the field of heat sinks and more specifically to the field of heat sinks configured to self-align with heat generating devices that may not be parallel to the heat sink.

BACKGROUND OF THE INVENTION

Modern electronics have benefited from the ability to fabricate devices on a smaller and smaller scale. As the ability to shrink devices has improved, so has their performance. Unfortunately, this improvement in performance is accompanied by an increase in power as well as power density in devices. In order to maintain the reliability of these devices, the industry must find new methods to remove this heat efficiently.

By definition, heat sinking means that one attaches a cooling device to a heat-generating component and thereby removes the heat to some cooling medium, such as air or water. Unfortunately, one of the major problems in joining two devices to transfer heat through a common surface is that a thermal interface is created at the junction. This thermal interface is characterized by a thermal contact impedance. Thermal contact impedance is a function of contact pressure, surface finish, and gap size. Thermal contact impedance also raises dramatically when the surfaces of the two devices are non-parallel. With non-parallel devices, only a small percentage of the possible contact area between the two devices is actually in contact and conducting heat.

As the power density of electronic devices increases, heat transfer from the heat generating devices to the surrounding environment becomes more and more critical to the proper operation of the devices. Many current electronic devices incorporate heat sink fins to dissipate heat to the surrounding air moving over the fins. These heat sinks are thermally connected to the electronic devices by a variety of techniques. Some devices use a thermally conductive paste in an attempt to lower the contact resistance. Others may use solder between the two elements both for mechanical strength and thermal conductance. Once again, if the two surfaces to be thermally coupled are not parallel difficulties may arise since the region of contact between the two surfaces forms a line instead of a plane. Thermal paste and solder are only usable for junctions with small amounts of non-co-planarity.

Many present electronic modules include a plurality of heat-generating electronic devices on a single substrate. Often these devices do not have a co-planer upper surface that would allow a single heat sink to be thermally coupled to the plurality of devices. Thermal paste and other thermally conductive materials, such as solder, may be used to fill small gaps between the heat-generating electronic devices and the single heat sink, however large gaps are often not capable of being filled by a paste or solder. In such cases, multiple heat sinks may be used, however, this adds cost and reduces the efficiency of the heat dissipation.

SUMMARY OF THE INVENTION

A heat-activated self-aligning heat sink is built thermally connecting at least one heat-generating devices on a substrate to the heat sink body, where the heat-generating devices may not be co-planar with each other due to tolerance stack-up or parallel with the heat sink body. A pedestal is attached to the substrate to support the heat sink body. A plug or floating pedestal is placed on top of each heat-generating device and held within the pedestal allowing sufficient movement for the bottom surface of the plug to fully contact the top surface of the heat-generating device. A quantity of a low melting temperature, thermally conductive material, such as solder, or a thermally conductive liquid, is placed over each plug and a heat sink body is placed over the assembly. When heated, the thermal material melts, forming a low impedance thermal junction between the plug and the heat sink body regardless of planarity differences between the two devices.

Other aspects and advantages of the present invention will become apparent from the following detailed description, taken in conjunction with the accompanying drawings, illustrating by way of example the principles of the invention.

DETAILED DESCRIPTION

Figure 1:
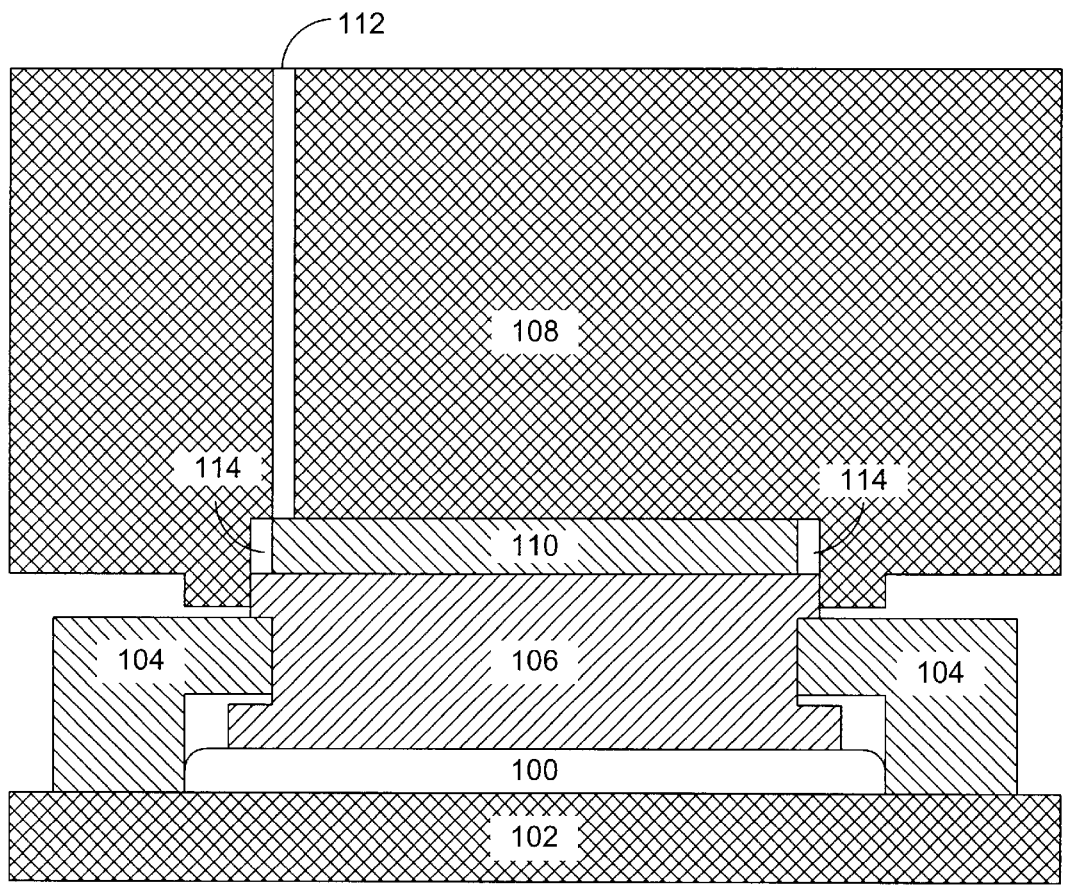
FIG. 1 is a cross-sectional view of an example embodiment of a heat-activated self-aligning heat sink according to the present invention before heat is applied.

FIG. 1 is a cross-sectional view of an example embodiment of a heat-activated self-aligning heat sink according to the present invention before heat is applied. A heat-generating device 100 is placed on a substrate 102 along with a pedestal 104. The pedestal 104 includes openings over the heat-generating device 100 allowing placement of a plug or floating pedestal 106 over the heat-generating device. The floating pedestal 106 fits within the pedestal 104 in such a way that it is able to move up or down to rest on the top surface of the heat-generating device 100 and may tilt slightly to match any tilt of the top surface of the heat-generating device 100. Some example embodiments of the present invention may include a quantity of thermally-conductive deformable material between the floating pedestal 106 and the heat-generating device 100, in order to minimize the thermal resistance between the floating pedestal 106 and the heat-generating device 100. A quantity of thermal material 110 is placed above the plug and the heat sink body 108 is placed over the assembly. The thermal material 110 comprises a low melting temperature, thermally conductive material such as solder. Note that the heat sink body 108 includes a cavity 114 in its bottom surface to accept the thermal material 110. When the heat sink body 108 is heated above the melting point of the thermal material 110 and compressive force is applied to the heat sink body 108 and the substrate 102, the thermal material 110 melts filling the cavity 114 between the heat sink body 108 and the floating pedestal 106. Note that the compressive force does not need to be large. Some example embodiments of the present invention may use the weight of the heat sink or the substrate to compress the heat sink assembly, and no external compressive force is required at all. The heat sink body 108 then moves down to rest on the pedestal 104 as shown in FIG. 2.

Figure 2:
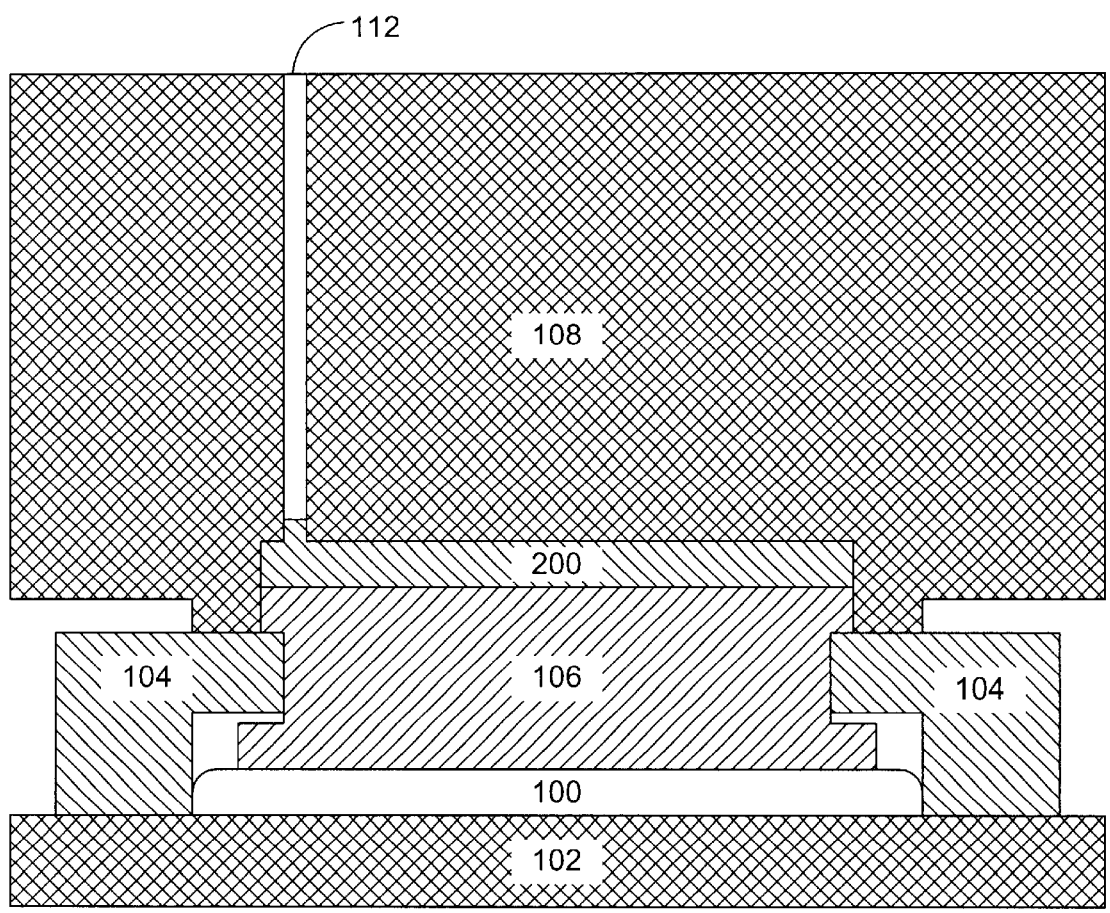
FIG. 2 is a cross-sectional view of the example embodiment of a heat-activated self-aligning heat sink according to the present invention from FIG. 1 after heat is applied.

FIG. 2 is a cross-sectional view of the example embodiment of a heat-activated self-aligning heat sink according to the present invention from FIG. 1 after heat is applied. Once heat and compressive force have been applied, the liquid thermal material 200 fills the cavity between the heat sink body 108 and the floating pedestal 106. Any excess thermal material travels up the vent hole 112. Note that at this point the heat sink body 108 may be mechanically attached to the pedestal 104 or directly to the substrate 102 to keep it from moving.

Figure 3:
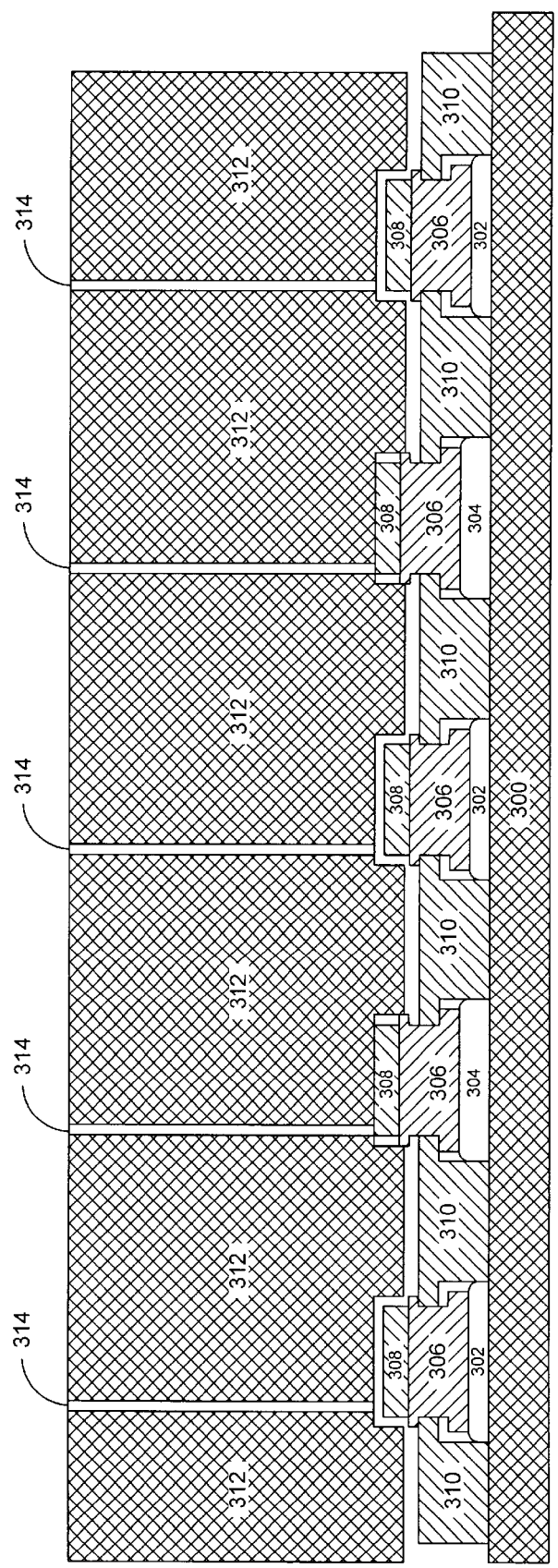
FIG. 3 is a cross-sectional view of an example embodiment of five heat-activated self-aligning heat sinks according to the present invention before heat is applied.

FIG. 3 is a cross-sectional view of an example embodiment of five heat-activated self-aligning heat sinks according to the present invention before heat is applied. In an example embodiment of the present invention, five heat-generating devices with two different heights are attached to a substrate 300. Short devices 302 are interspersed between tall devices 304. A pedestal 310 is attached to the substrate, and plugs or floating pedestals 306 are placed above the devices. Note that all of the floating pedestals 306 in this example embodiment are the same height. Other embodiments of the present invention may use floating pedestals 306 with different heights on the same assembly. Quantities of thermal material 308 are placed above each floating pedestal 306 and a heat sink body 312 is placed above the assembly. The heat sink body 312 includes vent holes 314 to allow any excess thermal material 308 to escape upon melting.

Figure 4:
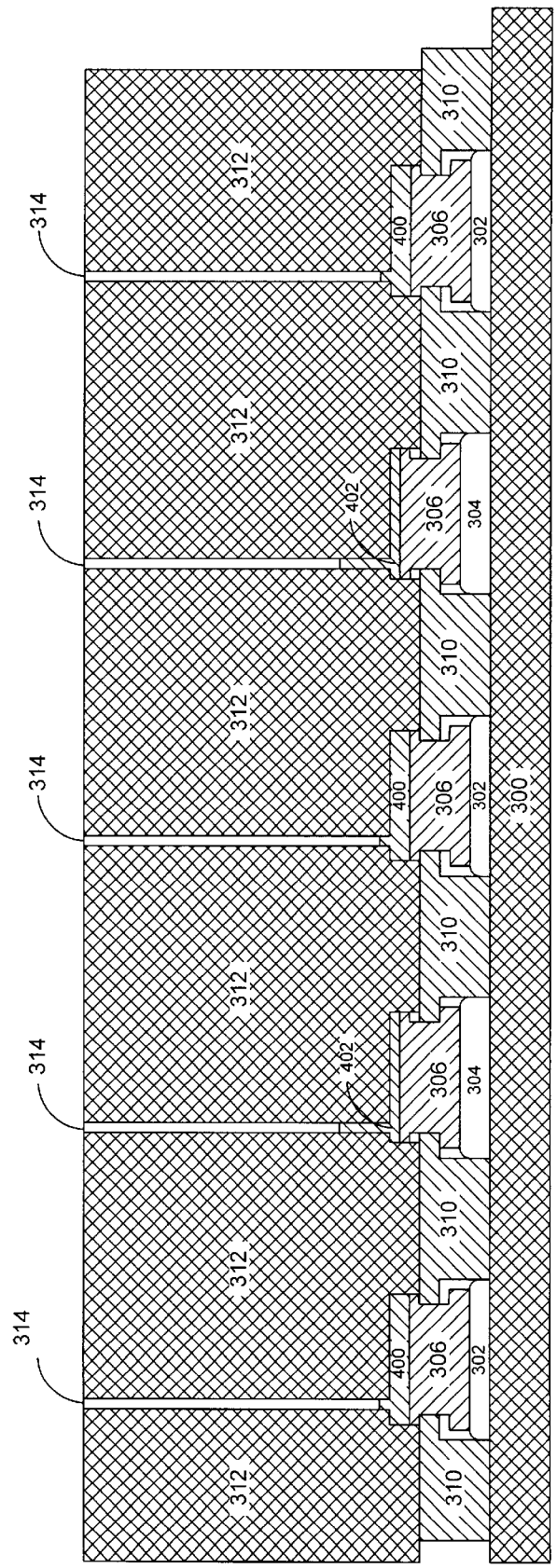
FIG. 4 is a cross-sectional view of the example embodiment of five heat-activated self-aligning heat sinks according to the present invention from FIG. 3 after heat is applied.

FIG. 4 is a cross-sectional view of the example embodiment of five heat-activated self-aligning heat sinks according to the present invention from FIG. 3 after heat is applied. Upon heating and applying a compressive force to the heat sink body 312 and the substrate 300, the thermal material 308 melts to form a liquid. Above the short devices 302, the liquid thermal material fills a larger cavity 400, while above the tall devices 304, the liquid thermal material fills a smaller cavity 402. Also note that more solder was expelled through the vent holes 314 over the tall devices 304 than through the vent holes 314 over the short devices 302.

Figure 5:
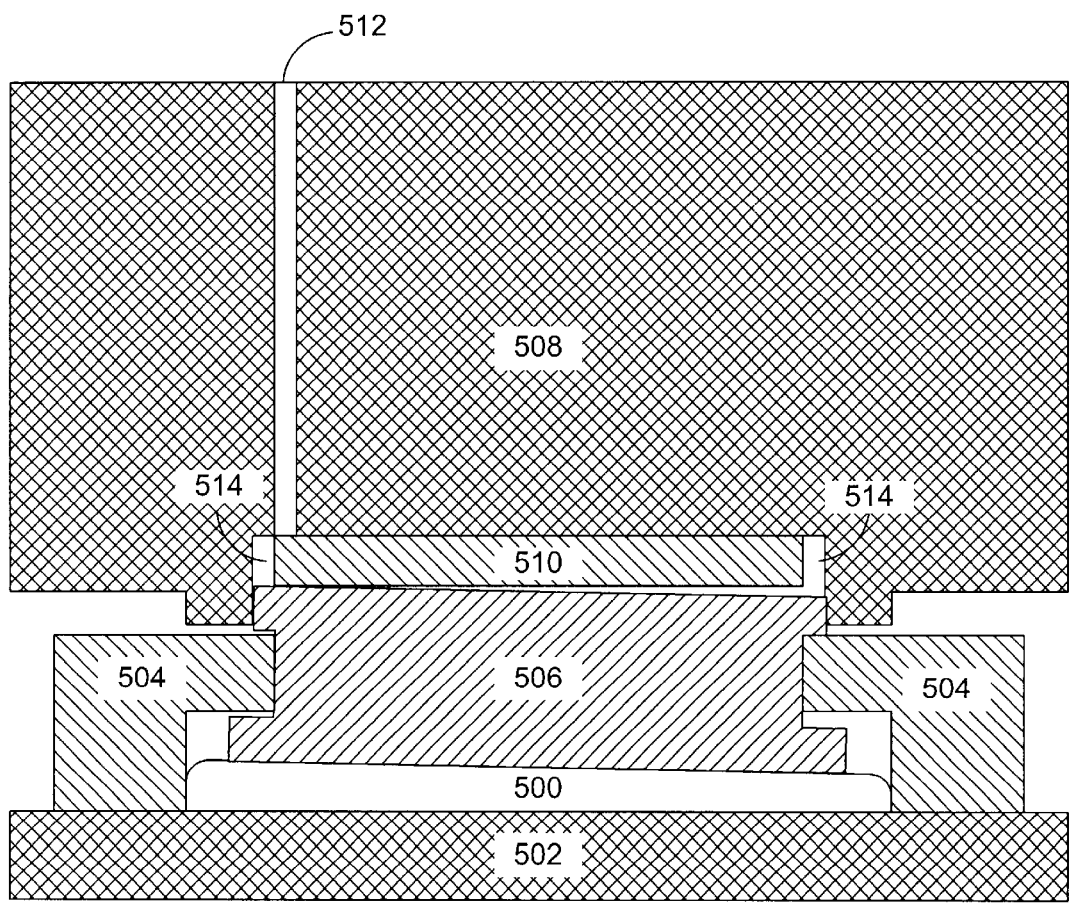
FIG. 5 is a cross-sectional view of an example embodiment of a heat-activated self-aligning heat sink according to the present invention before heat is applied.

FIG. 5 is a cross-sectional view of an example embodiment of a heat-activated self-aligning heat sink according to the present invention before heat is applied. The heat-activated self-aligning heat sink shown in this figure is identical to that of FIG. 1, except that it is used to make contact with a heat-generating device 500 that is not parallel with the bottom of the heat sink body 508. A heat-generating device 500 and a pedestal 504 are attached to a substrate 502. The pedestal 504 includes openings over the heat-generating device 500 allowing placement of a plug or floating pedestal 506 over the heat-generating device 500. The floating pedestal 506 fits within the pedestal 504 in such a way that it is able to move up or down to rest on the top surface of the heat-generating device 500 and has tilted slightly to match the tilt of the top surface of the heat-generating device 500. A quantity of thermal material 510 is placed above the plug and the heat sink body 508 is placed over the assembly. Note that the heat sink body 108 includes a cavity 514 in its bottom surface to accept the quantity of thermal material. When the heat sink body 508 is heated above the melting point of the thermal material 510 and compressive force is applied to the heat sink body 508 and the substrate 502, the thermal material 510 melts filling the cavity 514 between the heat sink body 508 and the floating pedestal 506 with a liquid. Note that the compressive force does not need to be large. Some example embodiments of the present invention may use the weight of the heat sink or the substrate to compress the heat sink assembly, and no external compressive force is required at all. The heat sink body 508 then moves down to rest on the pedestal 504 as shown in FIG. 6.

Figure 6:
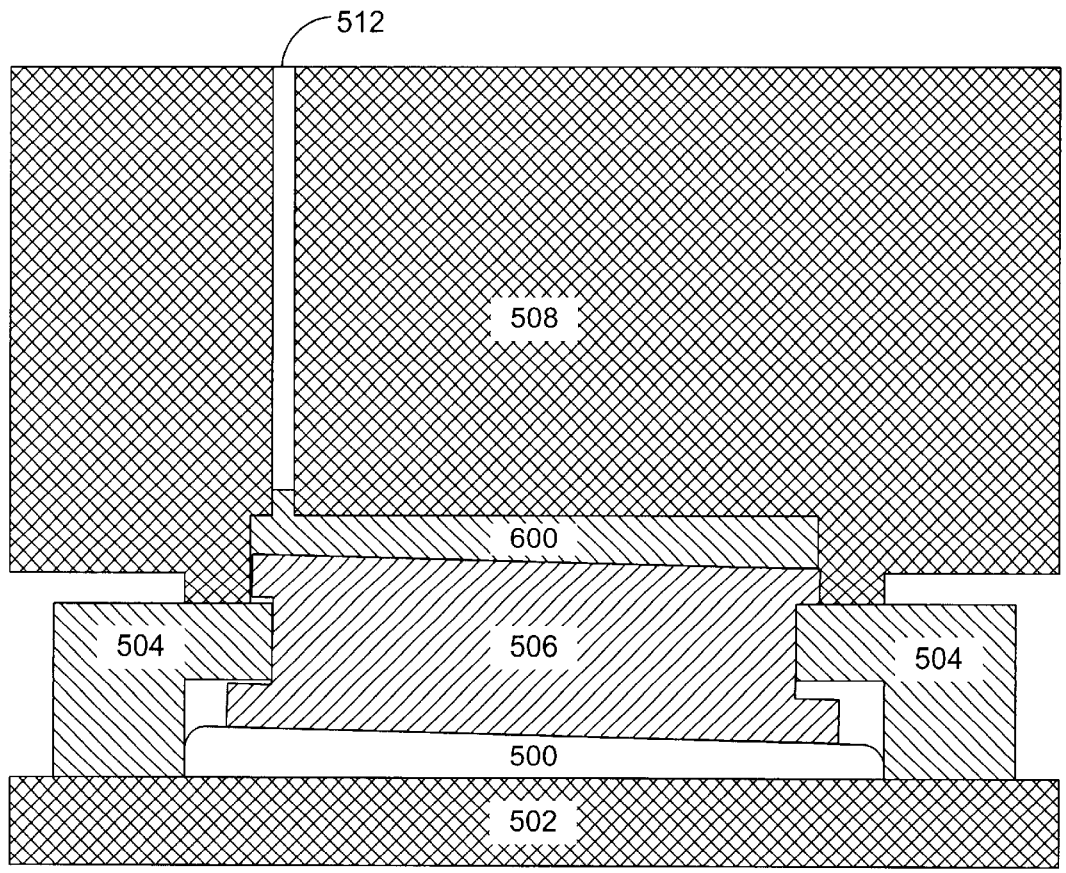
FIG. 6 is a cross-sectional view of the example embodiment of a heat-activated self-aligning heat sink according to the present invention from FIG. 5 after heat is applied.

FIG. 6 is a cross-sectional view of the example embodiment of a heat-activated self-aligning heat sink according to the present invention from FIG. 5 after heat is applied. Once heat and compressive force have been applied, the liquid thermal material 600, such as solder or other low melting temperature, thermally conductive material, fills the cavity between the heat sink body 508 and the floating pedestal 506. Any excess thermal material travels up the vent hole 512. Note that the thermal material has completely filled the cavity 514 creating a strong thermal connection between the floating pedestal 506 and the bottom of the heat sink body 508 even though their surfaces are not parallel. Also note that at this point the heat sink body 508 may be mechanically attached to the pedestal 504 or directly to the substrate 502 to keep it from moving.

Figure 7:
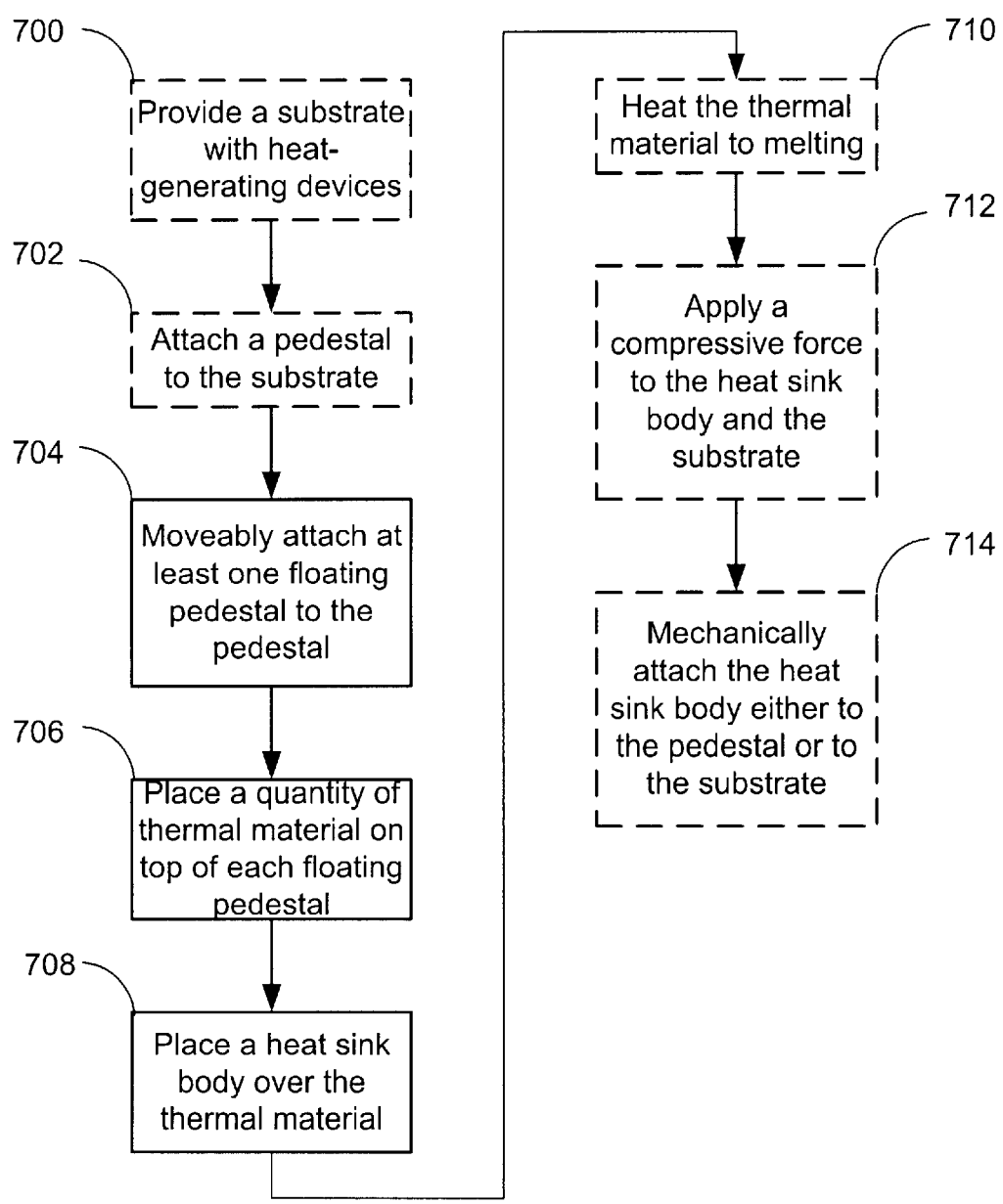
FIG. 7 is a flow chart of a method for constructing a heat-activated self-aligning heat sink according to the present invention.

FIG. 7 is a flow chart of a method for constructing a heat-activated self-aligning heat sink according to the present invention. In an optional step 700, a substrate including heat-generating devices that need to be cooled is provided. In an optional step 702, a pedestal is mechanically attached to the substrate. In a step 704, at least one floating pedestal is moveably attached to the pedestal. In a step 706, a quantity of thermal material is placed on top of each floating pedestal. In a step 708, a heat sink body is placed over the thermal material. In an optional step 710, the thermal material is heated to melting. In an optional step 712, compressive force is applied to the heat sink body and the substrate until the heat sink body rests on the pedestal. In an optional step 714 the heat sink body is mechanically connected to either the substrate or the pedestal.

Figure 8:
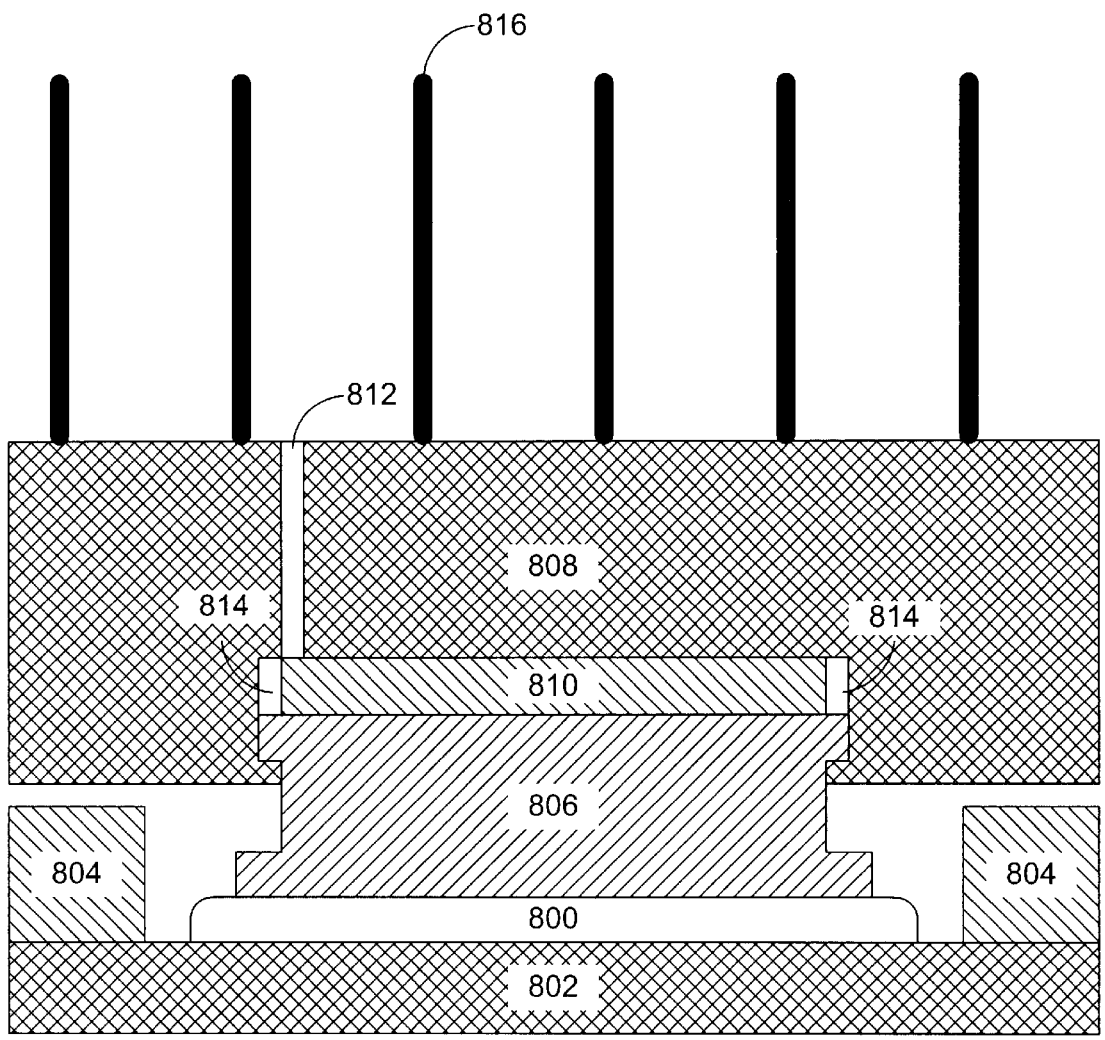
FIG. 8 is a cross-sectional view of an example embodiment of a heat-activated self-aligning heat sink according to the present invention before heat is applied.
Figure 9:
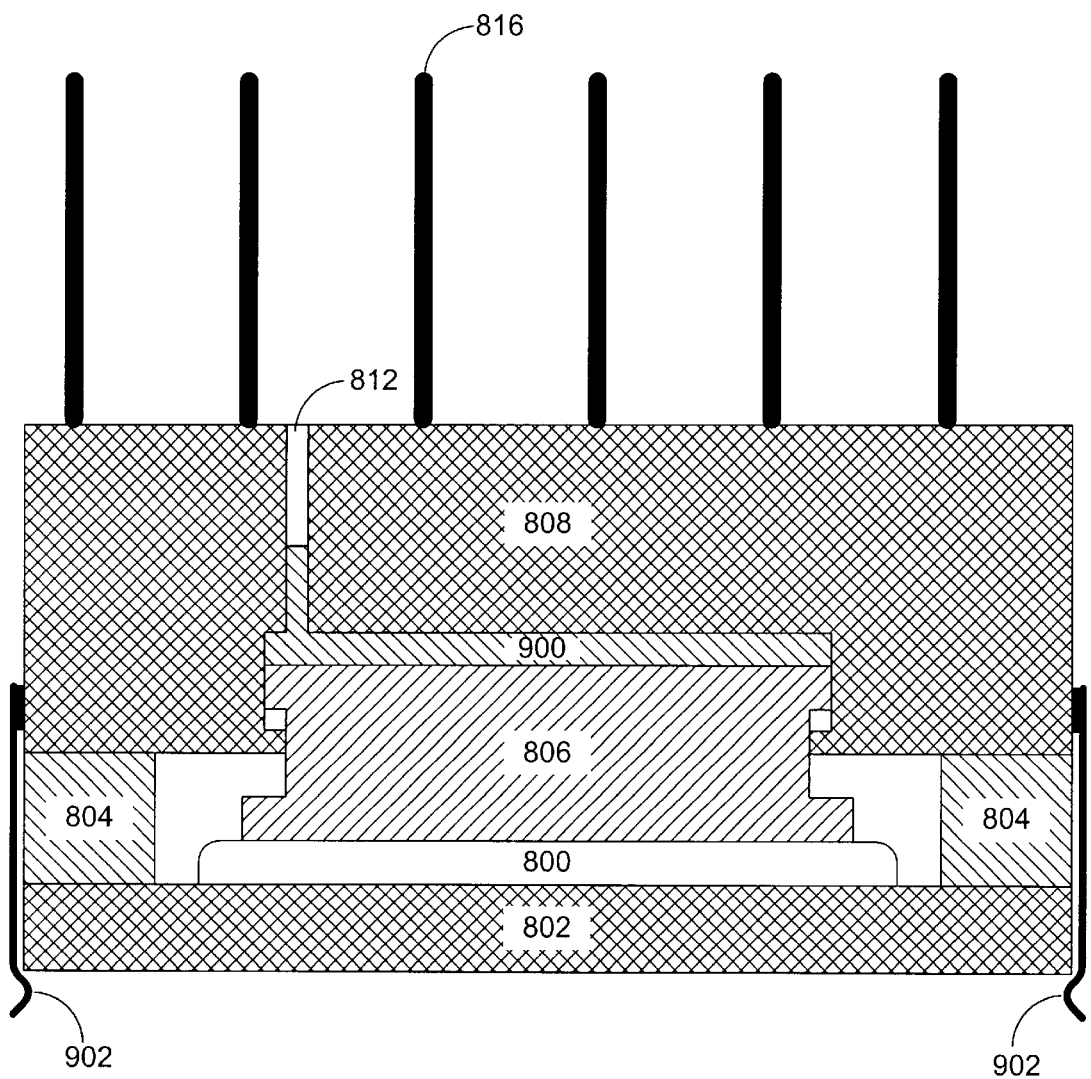
FIG. 9 is a cross-sectional view of the example embodiment of a heat-activated self-aligning heat sink according to the present invention from FIG. 8 after heat is applied.

FIG. 8 is a cross-sectional view of an example embodiment of a heat-activated self-aligning heat sink according to the present invention before heat is applied. In this example embodiment of the present invention a circuit board including a substrate 802, a heat-generating device 800, and a pedestal 804 is shown. A heat sink body 808 is constructed including at least one cavity 814 where the cavity 814 includes space for a quantity of thermal material and a means for capturing a plug or floating pedestal 806 allowing placement of the floating pedestal 806 over the heat-generating device 800. The floating pedestal 806 fits within the heat sink cavity 814 in such a way that it is able to move up or down to rest on the top surface of the heat-generating device 800 and may tilt slightly to match any tilt of the top surface of the heat-generating device 800. A quantity of thermal material 810 is placed above the plug and the heat sink body 808 is placed over the assembly. The thermal material 810 comprises a low melting temperature, thermally conductive material such as solder. Note that the cavity 814 in the bottom surface of the heat sink body 808 is configured to capture the thermal material 810 above the floating pedestal 806. When the heat sink body 808 is heated above the melting point of the thermal material 810 and compressive force is applied to the heat sink body 808 and the substrate 802, the thermal material 810 melts filling the cavity 814 between the heat sink body 808 and the floating pedestal 806 with a liquid. Note that the compressive force does not need to be large. Some example embodiments of the present invention may use the weight of the heat sink or the substrate to compress the heat sink assembly, and no external compressive force is required at all. The heat sink body 808 then moves down to rest on the pedestal 804 as shown in FIG. 9. Note that this example embodiment of the present invention includes a number of heat sink fins 816 attached to the heat sink body 808.

FIG. 9 is a cross-sectional view of the example embodiment of a heat-activated self-aligning heat sink according to the present invention from FIG. 8 after heat is applied. Once heat and compressive force have been applied, the liquid thermal material 900, such as solder or other low melting temperature, thermally conductive material, fills the cavity between the heat sink body 808 and the floating pedestal 806 with a liquid. Any excess thermal material travels up the vent hole 812. Note that at this point the completed heat sink may be mechanically attached to the pedestal 804 or directly to the substrate 802 to keep it from moving. In this example embodiment of the present invention, clips 902 are used to attach the heat sink to the substrate 802. However, many other methods of attachment, such as bolts, screws, glue, and solder, may be used within the scope of the present invention.

Figure 10:
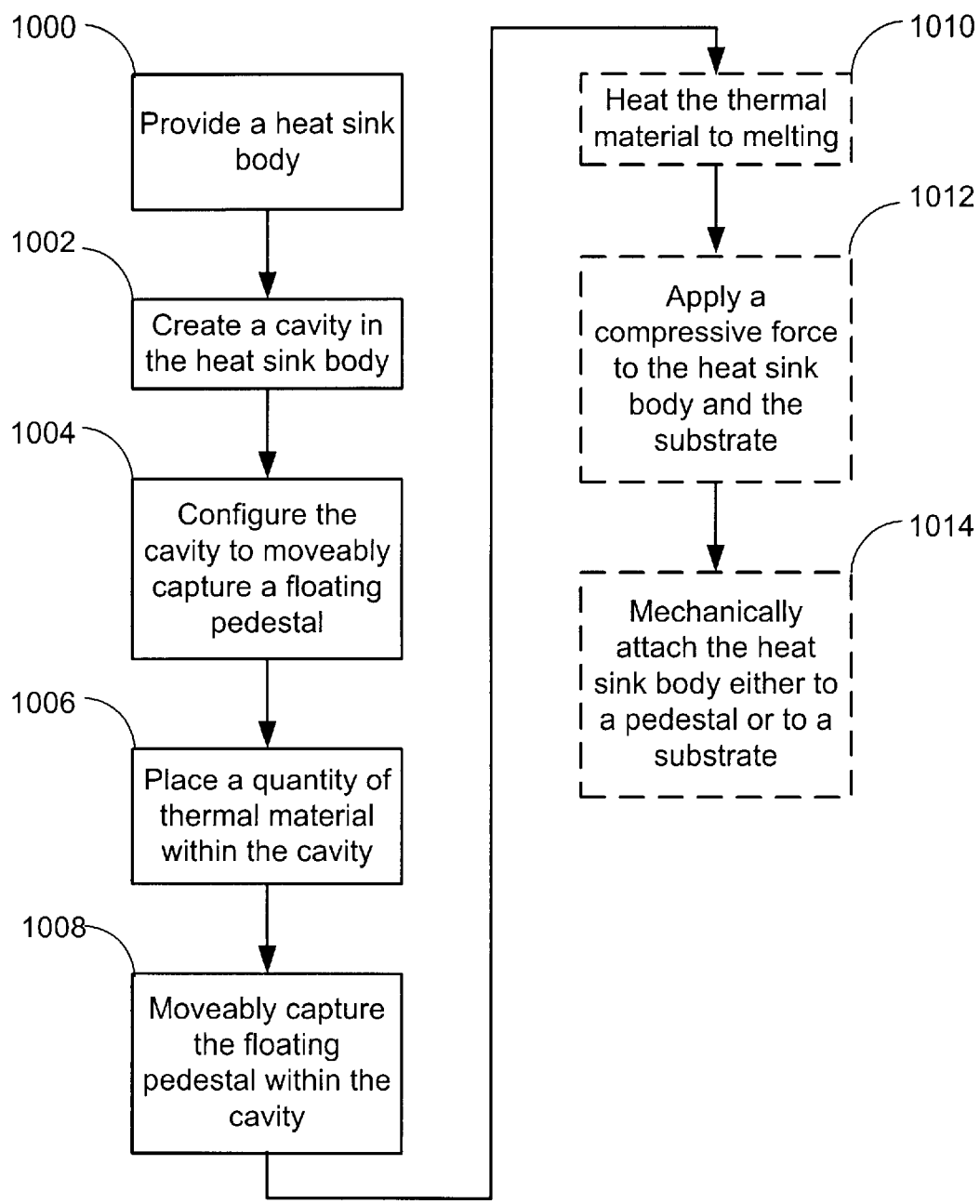
FIG. 10 is a flow chart of a method for constructing a heat-activated self-aligning heat sink according to the present invention.

FIG. 10 is a flow chart of a method for constructing a heat-activated self-aligning heat sink according to the present invention. In a step 1000, a heat sink body is provided. In a step 1002, a cavity is created in a bottom surface of the heat sink body. In a step 1004, the cavity is configured to moveably capture a floating pedestal. In a step 1006, a quantity of thermal material is placed within the cavity. In a step 1008, the floating pedestal is moveably captured within the cavity such that a bottom surface of the floating pedestal is configured to contact an upper surface of a heat-generating device attached to a substrate, and an upper surface of the floating pedestal is within the cavity. In an optional step 1010, the thermal material is heated to melting. In an optional step 1012, compressive force is applied to the heat sink body and the substrate until the heat sink body rests on the pedestal. In an optional step 1014 the heat sink body is mechanically connected to either the substrate or the pedestal.

Figure 11:
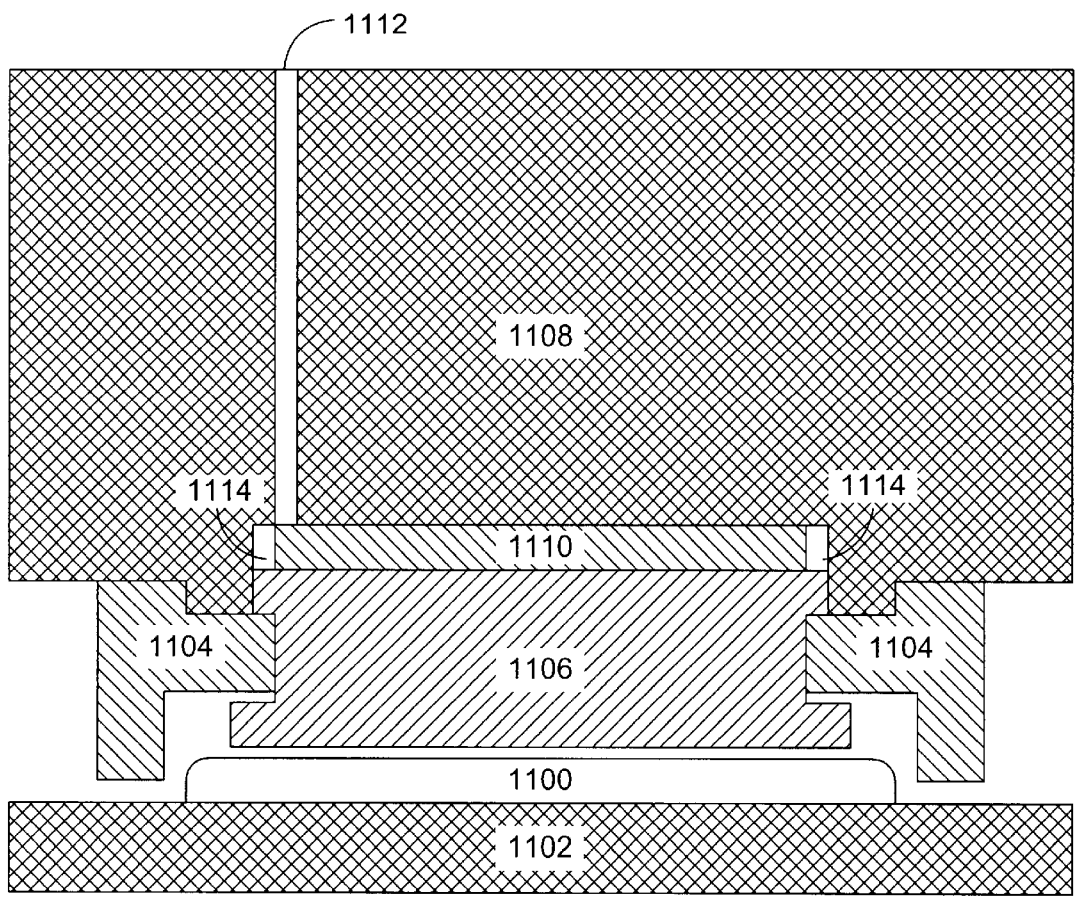
FIG. 11 is a cross-sectional view of an example embodiment of a heat-activated self-aligning heat sink according to the present invention before heat is applied.

FIG. 11 is a cross-sectional view of an example embodiment of a heat-activated self-aligning heat sink according to the present invention before heat is applied. The example embodiment of the present invention shown in FIG. 11 is identical to that of FIG. 1 with the exception that the pedestal 1104 is attached to the head sink body 1108 in stead of the substrate 1102. A heat-generating device 1100 is placed on a substrate 1102. A pedestal 1104 is attached to the heat sink body 1108. The pedestal 1104 includes openings over the heat-generating device 1100 allowing placement of a plug or floating pedestal 1106 over the heat-generating device 1100. The heat sink body 1108 also contains a cavity 1114 to contain a quantity of thermal material 1110. The floating pedestal 1106 fits within the pedestal 1104 in such a way that it is able to move up or down to rest on the top surface of the heat-generating device 1100 and may tilt slightly to match any tilt of the top surface of the heat-generating device 1100. A quantity of thermal material 1110 is placed above the plug within the cavity 1114 in the heat sink body 1108. The thermal material 1110 comprises a low melting temperature, thermally conductive material such as solder, or a thermally conductive liquid. When the heat sink body 1108 is heated above the melting point of the thermal material 1110 and compressive force is applied to the heat sink body 1108 and the substrate 1102, the thermal material 1110 melts filling the cavity 1114 between the heat sink body 1108 and the floating pedestal 1106. Note that the compressive force does not need to be large. Some example embodiments of the present invention may use the weight of the heat sink or the substrate to compress the heat sink assembly, and no external compressive force is required at all. The heat sink body 1108 then moves down such that the pedestal 104 rests on the substrate 1102 as shown in FIG. 12.

Figure 12:
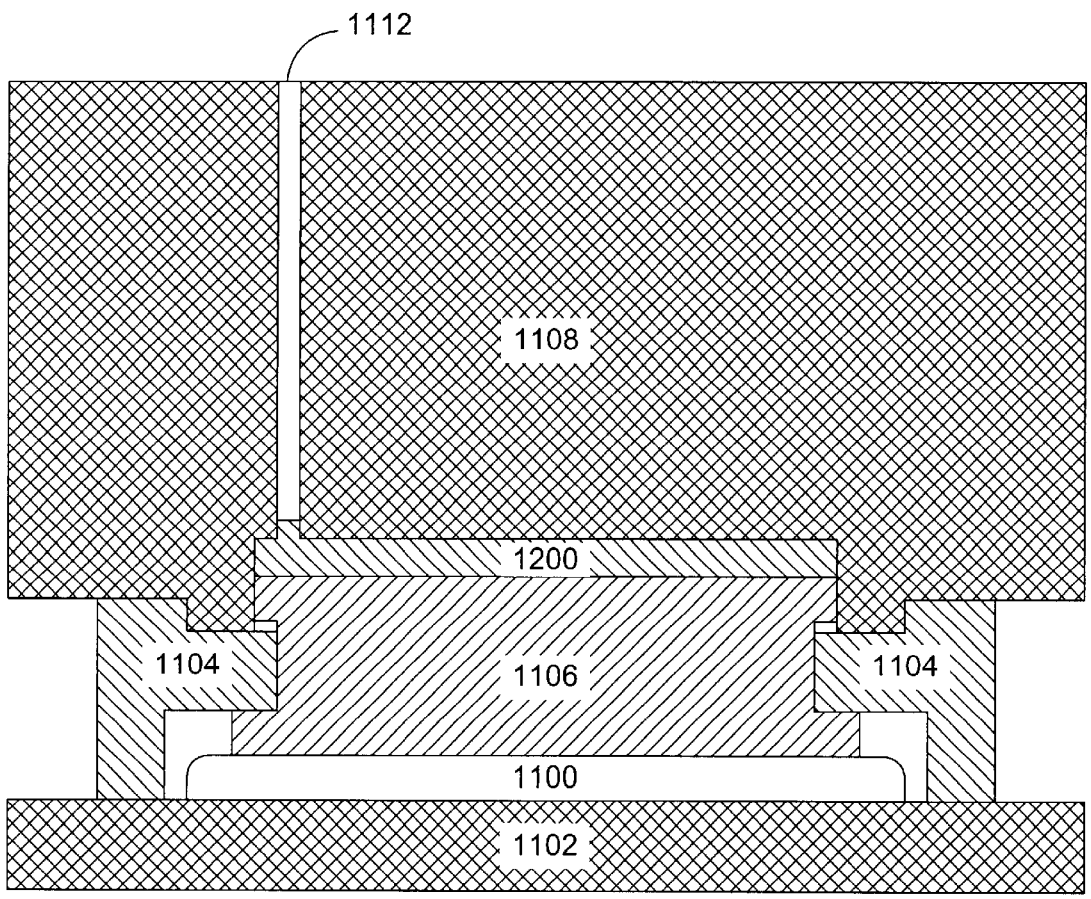
FIG. 12 is a cross-sectional view of the example embodiment of a heat-activated self-aligning heat sink according to the present invention from FIG. 11 after heat is applied.

FIG. 12 is a cross-sectional view of the example embodiment of a heat-activated self-aligning heat sink according to the present invention from FIG. 11 after heat is applied. Once heat and compressive force have been applied, the liquid thermal material 1200 fills the cavity between the heat sink body 1108 and the floating pedestal 1106. Any excess thermal material travels up the vent hole 1112. Note that at this point the heat sink body 1108 may be mechanically attached to the substrate 1102 to keep it from moving.

Figure 13:
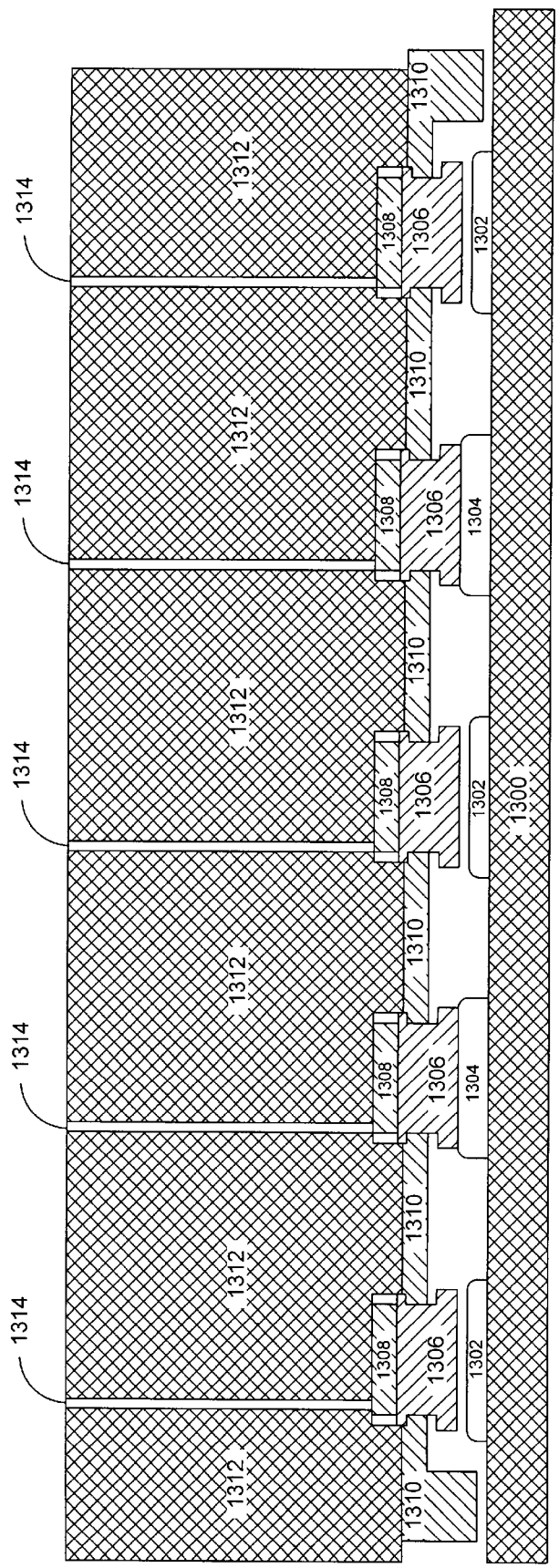
FIG. 13 is a cross-sectional view of an example embodiment of five heat-activated self-aligning heat sinks according to the present invention before heat is applied.

FIG. 13 is a cross-sectional view of an example embodiment of five heat-activated self-aligning heat sinks according to the present invention before heat is applied. In an example embodiment of the present invention, five heat-generating devices with two different heights are attached to a substrate 1300. Short devices 1302 are interspersed between tall devices 1304. A pedestal 1310 is attached to a heat sink body 1312, and plugs or floating pedestals 1306 are placed within the pedestal 1310 under cavities in the heat sink body 1312. Note that all of the floating pedestals 1306 in this example embodiment are the same height. Other embodiments of the present invention may use floating pedestals 1306 with different heights on the same assembly. Quantities of thermal material 1308 are placed within each cavity in the heat sink body 1312 above each floating pedestal 1306. In some embodiments of the present invention, the thermal material 1308 will be placed within each cavity before the floating pedestals 1306 are placed within the pedestal 1310. In other embodiments of the present invention where the thermal material is a thermally conductive liquid, the liquid may be placed in the chambers after assembly through vent holes 1314 within the heat sink body 1312 and the vent holes 1314 are plugged after filling the chamber with the liquid. If a low melting point solid thermal material is used, the vent holes 1314 allow any excess material to escape upon melting and compression of the assembly.

Figure 14:
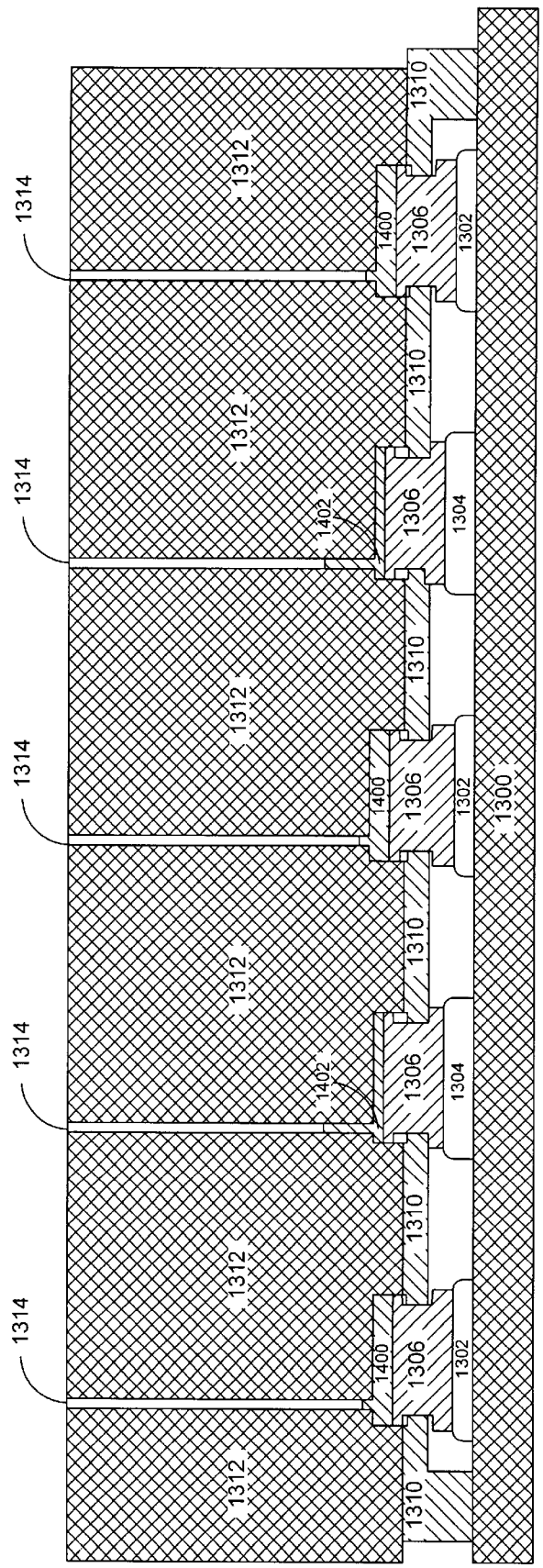
FIG. 14 is a cross-sectional view of the example embodiment of five heat-activated self-aligning heat sinks according to the present invention from FIG. 13 after heat is applied.

FIG. 14 is a cross-sectional view of the example embodiment of five heat-activated self-aligning heat sinks according to the present invention from FIG. 13 after heat is applied. Upon heating and applying a compressive force to the heat sink body 1312 and the substrate 1300, the thermal material 1308 melts to form a liquid. Above the short devices 1302, the liquid thermal material fills a larger cavity 1400, while above the tall devices 1304, the liquid thermal material fills a smaller cavity 1402. Also note that more solder was expelled through the vent holes 1314 over the tall devices 1304 than through the vent holes 1314 over the short devices 1302.

Figure 15:
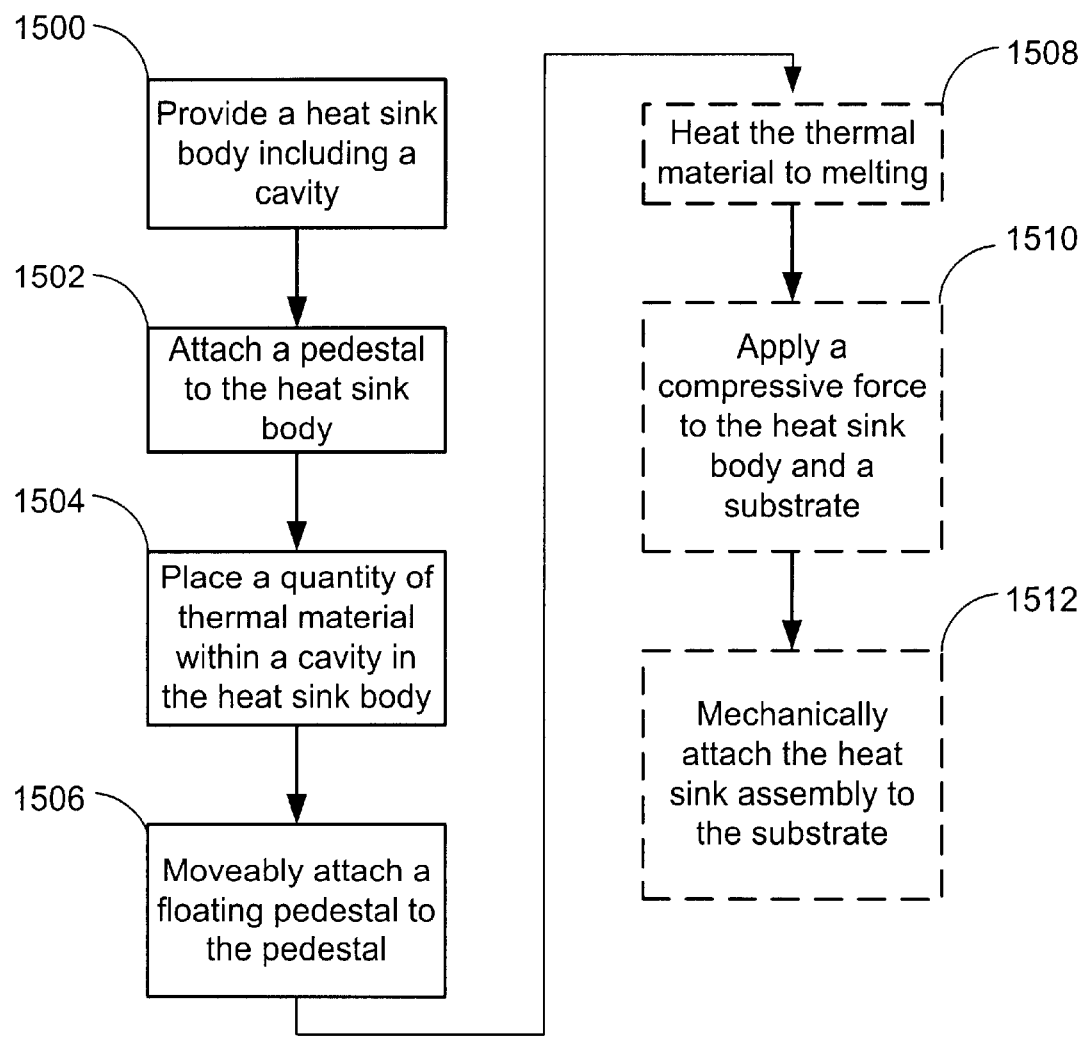
FIG. 15 is a flow chart of a method for constructing a heat-activated self-aligning heat sink according to the present invention.

FIG. 15 is a flow chart of a method for constructing a heat-activated self-aligning heat sink according to the present invention. In a step 1500, a heat sink body including a cavity is provided. In a step 1502, a pedestal is attached to the heat sink body. In a step 1504, a quantity of thermal material is placed within the cavity in the heat sink body. In a step 1506, a floating pedestal is moveably attached to the pedestal. In an optional step 1508, the thermal material is heated to melting. In an optional step 1510, a compressive force is applied to the heat sink body and a substrate including a heat-generating device. In an optional step 1512, the heat sink assembly is attached to the substrate.

The foregoing description of the present invention has been presented for purposes of illustration and description. It is not intended to be exhaustive or to limit the invention to the precise form disclosed, and other modifications and variations may be possible in light of the above teachings. The embodiments were chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A heat-activated self-aligning heat sink comprising:
   a heat sink body including a cavity in a bottom surface of said heat sink;
   a floating pedestal, including a recess in at least one side, moveably captured by said heat sink wherein an upper surface of said floating pedestal is within said cavity, wherein a bottom surface of said floating pedestals is configured to contact an upper surface of a heat-generating device;
   a quantity of thermal material located between said upper surface of said floating pedestal and said cavity; and
   wherein when said thermal material is heated above a melting temperature of said thermal material and a compressive force is applied to said heat sink body and a substrate, said thermal material melts, substantially filling said cavity.

2. A heat-activated self-aligning heat sink as claimed in claim 1,
   wherein said heat sink body includes a vent hole connected with an upper surface of said cavity to an upper surface of said heat sink body.

3. A heat-activated self-aligning heat sink as claimed in claim 2,
   wherein when said thermal material melts excess thermal material flows into said vent hole.

4. A heat-activated self-aligning heat sink as claimed in claim 1, further comprising:
   a thermally-conductive deformable Material between said floating pedestal and the heat-generating device.

5. A heat-activated self-aligning heat sink as claimed in claim 1, wherein said heat sink body includes fins.

6. A heat-activated self-aligning heat sink as claimed in claim 1,
   wherein said floating pedestal is configured to tilt to match an angle of tilt of the upper surface of the heat-generating device.

7. A heat-activated self-aligning heat sink as claimed in claim 1,
   wherein said heat sink body is configured to mechanically attach to a pedestal, mechanically attached to the substrate.

8. A heat-activated self-aligning heat sink as claimed in claim 1,
   wherein said heat sink body is configured to mechanically attach to the substrate.

9. A heat-activated self-aligning heat sink comprising:
   a heat sink body including a cavity in a bottom surface of said heat sink;
   a pedestal attached to said heat sink;
   a floating pedestal moveably captured by said pedestal wherein an upper surface of said floating pedestal is within said cavity, wherein a bottom surface of said floating pedestals is configured to contact an upper surface of a heat-generating device;
   a quantity of thermal material located between said upper surface of said floating pedestal and said cavity; and
   wherein when said thermal material is heated above a melting temperature of said thermal material and a compressive force is applied to said heat sink body and a substrate, said thermal material melts, substantially filling said cavity.

10. A heat-activated self-aligning heat sink as claimed in claim 9,
    wherein said heat sink body includes a vent hole connected with an upper surface of said cavity to an upper surface of said heat sink body.

11. A heat-activated self-aligning heat sink as claimed in claim 10,
    wherein when said thermal material melts excess thermal material flows into said vent hole.

12. A heat-activated self-aligning heat sink as claimed in claim 9, further comprising:
    a thermally-conductive deformable material between said floating pedestal and the heat-generating device.

13. A heat-activated self-aligning heat sink as claimed in claim 9,
    wherein said heat sink body includes fins.

14. A heat-activated self-aligning heat sink as claimed in claim 9,
    wherein said floating pedestal is configured to tilt to match an angle of tilt of the upper surface of the heat-generating device.

15. A heat-activated self-aligning heat sink as claimed in claim 9,
    wherein said heat sink body is configured to mechanically attach to the substrate.

16. A heat-activated self-aligning heat sink comprising:
a heat sink body including a cavity in a bottom surface of said heat sink body;
a pedestal mechanically attached to a substrate;
a floating pedestal moveably captured by said pedestal, wherein a bottom surface of said floating pedestals is configured to contact an upper surface of a heat-generating device attached to the substrate;
a quantity of thermal material configured to fit between said floating pedestal and said cavity in said bottom surface of said heat sink body; and
wherein when said thermal material is heated above a melting temperature of said thermal material and a compressive force is applied to said heat sink body and the substrate, said thermal material melts, substantially filling said cavity.

17. A heat-activated self-aligning heat sink as claimed in claim 16,
wherein said heat sink body includes a vent hole connected with an upper surface of said cavity to an upper surface of said heat sink body.

18. A heat-activated self-aligning heat sink as claimed in claim 17,
wherein when said thermal material melts excess liquid thermal material flows into said vent hole.

19. A heat-activated self-aligning heat sink as claimed in claim 16, further comprising:
a thermally-conductive deformable material between said floating pedestal and the heat-generating device.

20. A heat-activated self-aligning heat sink as claimed in claim 16,
wherein said heat sink body includes fins.

21. A heat-activated self-aligning heat sink as claimed in claim 16,
wherein said floating pedestal is configured to tilt to match an angle of tilt of the upper surface of the heat-generating device.

22. A heat-activated self-aligning heat sink as claimed in claim 16,
wherein said heat sink body is configured to mechanically attach to said pedestal.

23. A heat-activated self-aligning heat sink as claimed in claim 16,
wherein said heat sink body is configured to mechanically attach to the substrate.

24. A method for the construction of a heat-activated self-aligning heat sink comprising the steps of:
a) providing a heat sink body;
b) creating a cavity in a bottom surface of the heat sink body;
c) moveably attaching a floating pedestal to a pedestal mechanically attached to a substrate;
d) placing a quantity of thermal material on a top surface of the floating pedestal; and
e) placing the heat sink body over the thermal material such that the thermal material is captured between the cavity and the floating pedestal.

25. A method for the construction of a heat-activated self-aligning heat sink as claimed in claim 24, further comprising the step of:
f) heating the thermal material to a temperature greater than a melting point of the thermal material, resulting in the thermal material turning into a liquid.

26. A method for the construction of a heat-activated self-aligning heat sink as claimed in claim 25, further comprising the step of:

g) applying a compressive force to the heat sink body and the substrate sufficient to compress the assembly such that the heat sink body contacts the pedestal.

27. A method for the construction of a heat-activated self-aligning heat sink as claimed in claim 26, further comprising the step of:
f) mechanically attaching the heat sink body to the pedestal.

28. A method for the construction of a heat-activated self-aligning heat sink as claimed in claim 26, further comprising the step of:
f) mechanically attaching the heat sink body to the substrate.

29. A method for the construction of a heat-activated self-aligning heat sink as claimed in claim 26,
wherein during said heating step, the liquid thermal material substantially fills a cavity in the bottom surface of the heat sink body.

30. A method for the construction of a heat-activated self-aligning heat sink comprising the steps of:
a) providing a heat sink body;
b) creating a cavity in a bottom surface of the heat sink body;
c) attaching a pedestal to the heat sink body;
d) placing a quantity of thermal material within the cavity; and
e) moveably attaching a floating pedestal to the pedestal such that the thermal material is captured between the cavity and the floating pedestal.

31. A method for the construction of a heat-activated self-aligning heat sink as claimed in claim 30, further comprising the step of:
f) heating the thermal material to a temperature greater than a melting point of the thermal material, resulting in the thermal material turning into a liquid.

32. A method for the construction of a heat-activated self-aligning heat sink as claimed in claim 31, further comprising the step of:
g) applying a compressive force to the heat sink body and the substrate sufficient to compress the assembly such that the pedestal contacts a substrate.

33. A method for the construction of a heat-activated self-aligning heat sink as claimed in claim 32, further comprising the step of:
h) mechanically attaching the heat sink body to a substrate.

34. A method for the construction of a heat-activated self-aligning heat sink as claimed in claim 32, further comprising the step of:
h) mechanically attaching the pedestal to a substrate.

35. A method for the construction of a heat-activated self-aligning heat sink as claimed in claim 32,
wherein during said heating step, the liquid thermal material substantially fills a cavity in the bottom surface of the heat sink body.

36. A method for the construction of a heat-activated self-aligning heat sink comprising the steps of:
a) providing a heat sink body;
b) creating a cavity in a bottom surface of the heat sink body;
c) configuring the cavity to moveably capture a floating pedestal;
d) placing a quantity of thermal material within said cavity; and e) moveably capturing the floating pedestal partially within said cavity, wherein a bottom surface of the floating pedestal is configured to contact an upper surface of a hear-generating device attached to a substrate, and an upper surface of the floating pedestal is within said cavity.

37. A method for the construction of a heat-activated self-aligning heat sink as claimed in claim 36, further comprising the step of:

f) heating the thermal material to a temperature greater than a melting point of the thermal material, resulting in the thermal material turning into a liquid.

38. A method for the construction of a heat-activated self-aligning heat sink as claimed in claim 37, further comprising the step of:

g) applying a compressive force to the heat sink body and the substrate sufficient to compress the assembly such that the heat sink body contacts the pedestal.

39. A method for the construction of a heat-activated self-aligning heat sink as claimed in claim 38, further comprising the step of f) mechanically attaching the heat sink body to the pedestal.

40. A method for the construction of a heat-activated self-aligning heat sink as claimed in claim 38, further comprising the step of:

f) mechanically attaching the heat sink body to the substrate.

41. A method for the construction of a heat-activated self-aligning heat sink as claimed in claim 38, wherein during said heating step, the liquid thermal material substantially fills the cavity in the bottom surface of the heat sink body.

42. A heat-activated self-aligning heat sink comprising:

a heat sink body including a cavity;

a floating pedestal, wherein a bottom surface of said floating pedestals is configured to contact an upper surface of a heat-generating device attached to a substrate;

a quantity of thermal material;

means for moveably capturing said floating pedestal partially within the cavity; and means for containing said quantity of thermal material within said cavity.

43. A heat-activated self-aligning heat sink as claimed in claim 42, further comprising:

means for beating said quantity of thermal material to a temperature greater than a melting point of said thermal material.

44. A heat-activated self-aligning heat sink as claimed in claim 43, further comprising:

means for applying a compressive force to said heat sink body and the substrate.

\* \* \* \* \*